United States Patent [19]
Testardi

[11] Patent Number: 5,075,281
[45] Date of Patent: Dec. 24, 1991

[54] METHODS OF MAKING A HIGH DIELECTRIC CONSTANT, RESISTIVE PHASE OF $YBA_2CU_3O_X$ AND METHODS OF USING THE SAME

[76] Inventor: Louis R. Testardi, 2731 Blair Stone Rd. #175, Tallahassee, Fla. 32301

[21] Appl. No.: 292,827

[22] Filed: Jan. 3, 1989

[51] Int. Cl.$^5$ ...................... H01L 39/00; H01G 4/06
[52] U.S. Cl. .................................. 505/1; 219/121.66; 361/311
[58] Field of Search ............... 357/5, 83, 51; 252/518, 252/519; 361/311, 321; 29/25.42; 505/1, 873, 922, 923; 219/121.65, 121.66

[56] References Cited

U.S. PATENT DOCUMENTS

| | | | |
|---|---|---|---|
| 3,274,025 | 9/1966 | Ostis | 361/311 X |
| 3,522,492 | 8/1970 | Pierce | 357/83 X |
| 4,229,865 | 10/1980 | Fanning | 29/25.42 |
| 4,395,813 | 8/1983 | Roth et al. | 505/922 X |
| 4,482,933 | 11/1984 | Alexander | 361/321 |
| 4,490,733 | 12/1984 | Kroger | 357/5 |
| 4,586,062 | 4/1986 | Bouffard et al. | 505/873 X |
| 4,701,592 | 10/1987 | Cheung | 219/121.77 |
| 4,809,133 | 2/1989 | Faris et al. | 357/83 X |
| 4,872,086 | 10/1989 | Huang et al. | 361/321 |
| 4,891,355 | 1/1990 | Hayashi et al. | 505/1 |
| 4,912,087 | 3/1990 | Aslam et al. | 505/1 |
| 4,916,115 | 4/1990 | Mantese et al. | 505/1 |
| 4,918,051 | 4/1990 | Mantese et al. | 505/1 |

FOREIGN PATENT DOCUMENTS 265886  5/1988  European Pat. Off. ................ 505/1

OTHER PUBLICATIONS

Applied Physics Lett. vol. 51, No. 2 Jul. 13, 1987 pp. 139 to 141 Clark et al.
Effects of Radiation Damage in Ion-Implanted Thin Films of Metal-Oxide Superconductors.
Japanese Journal of Applied Physics Oct. 1987, vol. 26, No. 10 pp. L1731-L1733.
Japanese Journal of Applied Physics Dec. 1987, vol. 26, No. 12, pp. L1991-L1993.
Testardi et al., "Superconducting and Nonsuperconducting Phases . . .", Physical Review B, vol. 36, pp. 8816ff, Dec. 1, 1987.
Testardi et al., "Large Static Dielectric Constant . . .", Physical Review B, vol. 37, pp. 2324f, Feb. 1, 1988.

*Primary Examiner*—Clifford C. Shaw

[57] ABSTRACT

A material phase of quenched $YBa_2Cu_3O_x$ exhibits a high dielectric constant ($\kappa \approx 700$ at room temperature) and is useful in the fabrication of capacitors. A particularly effective method of producing the material phase involves using laser illumination of the $YBa_2Cu_3O_x$ to provide the conditions necessary for quenching. Such laser illumination can lead to fine line patterning of electrically resistive and high dielectric constant material from a conducting or superconducting matrix.

18 Claims, 1 Drawing Sheet

METHODS OF MAKING A HIGH DIELECTRIC CONSTANT, RESISTIVE PHASE OF $YBa_2Cu_3O_x$ AND METHODS OF USING THE SAME

FIELD OF THE INVENTION

This invention pertains to the field of electrical and electronic materials. More particularly, this invention pertains to electrical and electronic materials which exhibit changes in resistivity and dielectric constant upon processing. Still more particularly, this invention pertains to applications of the new high temperature superconductor materials which involve device modifications of the new high temperature superconductor materials by quenching to produce such changes in resistivity and dielectric constant.

BACKGROUND OF THE INVENTION

Recent discoveries have revealed that $YBa_2Cu_3O_x$ may be prepared in the form $YBa_2Cu_3O_7$ to produce a material which exhibits superconductivity at temperatures below 95 degrees Kelvin.

It has also been shown that one can produce a state of high electrical resistivity in $YBa_2Cu_3O_x$ by quenching $YBa_2Cu_3O_6$ from 900 degrees Celsius and above to room temperature.

It is also known, generally in the field of materials processing, that irradiation of a material by a laser and subsequent cooling of the material can lead to a quenched state of the material.

OBJECTS OF THE INVENTION

It is an object of the invention to provide new uses of quenched $YBa_2Cu_3O_x$, in particular, the fabrication of capacitors and the patterning of conducting or superconducting material interleaved with electrically resistive and high dielectric constant material.

It is a further object of the invention to produce structures of superconducting and insulating, high dielectric constant material which will function as a superconducting quantum interference device (SQUID) for the measurement of numerous electrical, magnetic, and biological phenomena.

It is a still further object of the invention to employ non-contact patterning, such as laser writing, to produce patterns of conducting or superconducting material interleaved with electrically resistive and high dielectric constant material useful in modern electronic and optoelectronic technology.

DETAILED DESCRIPTION OF THE INVENTION

It is the current trend to utilize mixtures of oxides or carbonates with yttrium (or other rare earth elements), barium, and copper heated to approximately 850 degrees Celsius and above and then slowly cooled to produce a superconducting material phase. When such mixtures are rapidly cooled (i.e. quenched, for example, within one second to room temperature) from these high temperatures, a material phase is obtained which has a high electrical resistivity and is not superconducting.

It was not known, however, that such a process also produces a material phase having a high dielectric constant. Moreover, this result is unexpected and is not obvious in view of the fact that it has heretofore never been demonstrated that a high dielectric constant material could be produced from a phase which becomes superconducting at low temperatures by quenching.

Figure 1:
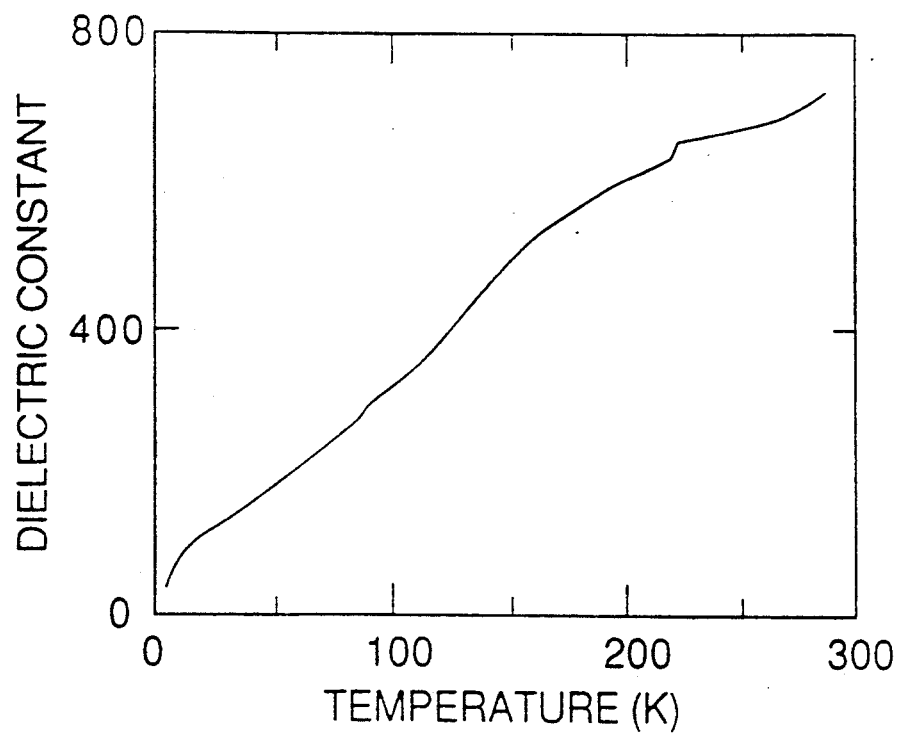
FIG. 1 shows a graph of the dielectric constant vs. temperature for a quenched (from 900 degrees Celsius or higher) material phase sample of $YBa_2Cu_3O_x$.

The high dielectric constant of $YBa_2Cu_3O_x$ vs. temperature is shown in FIG. 1. A disk shaped sample of $YBa_2Cu_3O_x$ (i.e. $YBa_2Cu_3O_6$) was prepared according to current practices in the fabrication of ceramic type superconductors (as described, for example, by Testardi et al. in Physical Review B, volume 36, pages 8816ff, 1987, the contents of which is herein incorporated by reference). The disk shaped sample was cut from a larger sample quenched from between 900 and 950 degrees Celsius into water within a one second period. The polycrystalline disk shaped sample which measured 0.635 cm in diameter and 0.047 cm in thickness was coated on its end faces with silver paint. The sample density was about 70% of the theoretical value. Two terminal admittance measurements (with four terminal coaxial lead techniques) were made from 4.3 to 300 degrees Kelvin. The measurement frequency was generally 20 kHz with a signal amplitude of 1 volt rms. The dielectric constant $\kappa$ was obtained from the capacitance through the relation $C_p = A\epsilon_0\kappa/d$, where A and d are the sample area and thickness and $\epsilon_0$ is the electric permittivity of free space. At room temperature, $\kappa \approx 700$.

A test for the absence of large space charge or interfacial effects was made at 4.3 degrees Kelvin by reducing the measurement frequency by a factor of 30 (from 20 to 0.7 kHz) and observing the susceptance (capacitance) and conductance in the two parallel element equivalent circuit varied by less than 5%. At 300 degrees Kelvin, a much more limited test (frequency reduction by a factor of two) was carried out (with similar results) due to limitations from the much higher dissipation factor. A linear response check was also made at 4.3 degrees Kelvin by noting that the real and imaginary parts of the admittance changed by less than 5% with signal levels of 0.01 and 1 volt rms. The dielectric constant measurements were made under mechanically unclamped (sample resonant frequency much greater than 20 kHz), adiabatic (inverse sample thermal diffusion time less than 20 kHz), and constant E field conditions.

Materials with high dielectric constants are useful in storage of electrical charge, for instance, in capacitors which are used in diverse electrical and electronic applications.

Figure 2:
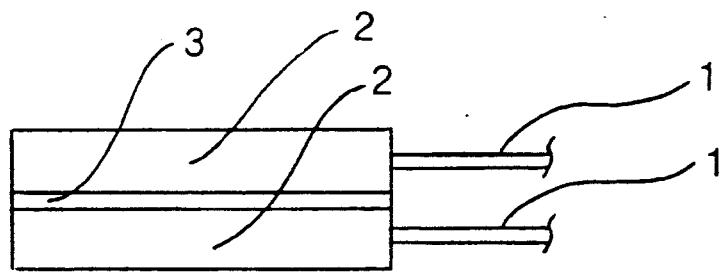
FIG. 2 is a diagrammatic representation of a capacitor utilizing quenched $YBa_2Cu_3O_x$ for the dielectric material according to the invention.

According to the invention, a capacitor may be fabricated using quenched $YBa_2Cu_3O_6$ as the dielectric material, as shown in FIG. 2. Particularly, FIG. 2 reveals a capacitor useful for the storage of electrical charge having a pair of electrical leads 1 providing electrical contact to a pair of electrically conducting plates 2 (for storing the electrical charge) which are separated by a dielectric material comprising the $YBa_2Cu_3O_6$ shown at 3. To design the capacitor for maximum capacity, it is advantageous to maximize the overlapping area of the plates 2, to minimize the thickness of the dielectric material 3, and to maximize the dielectric constant of the dielectric material 3. It is further advantageous to make the plates 2 from superconducting material in order to provide decreased charge and discharge times.

A further new use of the quenched $YBa_2Cu_3O_x$ is in the production of patterned circuits in which quenched regions of the material are made to lie adjacent to unquenched regions of the material, thereby giving rise to electrically resistive and high dielectric constant material which lies adjacent to superconducting material. A particularly efficacious employment of this is in the use of non-contact laser patterning of insulating/conducting configurations where the laser illumination provides the conditions necessary for quenching. Suitable quenching rates for the formation of the resistive/high dielectric constant material phase of $YBa_2Cu_3O_x$ can be obtained by utilizing the thermal diffusivity of the material itself (or a substrate on which the material rests) if the portion heated by the laser is kept sufficiently small. From heat transfer theory, it can be shown that a small volume with a linear dimension 1 will lose most of its elevated temperature following initial heating in a time given by $t \approx l^2/(4D)$ where D is the thermal diffusivity of the material. For this material, $D \approx 10^{-1}$ cm$^2$/sec, and thus, sufficiently rapid cooling will occur if l is less than 1 mm.

According to the invention, laser (or any other focusable heat source e.g. electron beam) illumination is used to provide the localized heating of a thin film of $YBa_2Cu_3O_x$ initially prepared by standard methods so as to be superconducting at low temperatures. If the film thickness is less than the optical penetration, a lateral tracing of the laser beam on the thin film may be used to provide non-contact, depth independent patterning of a high resistance, high dielectric constant phase from the conducting matrix. Fine line patterned features of quenched $YBa_2Cu_3O_x$ with a width comparable to that of the laser beam can thus be achieved by employing ordinary optical means. If the film thickness is greater than the depth of optical penetration of the laser, then patterning may occur in the thickness dimension of the film as well. This process can thus lead to three dimensional patterning.

The ability to pattern or write a high resistivity/high dielectric constant material with high resolution can lead to numerous integrated circuit type applications such as capacitor fabrication, resistor fabrication, current steering, and fabrication of all devices utilizing intimate contact metal-insulator or metal-semiconductor interfaces.

Another application lies in the field of superconductivity where intimate contact of a superconductor and a non-superconductor (or weaker superconductor, e.g. the "weak link") can give rise to numerous phenomena. Weak links or insulating layers formed between and in intimate contact with superconductors show a host of well-known quantum phenomena which fall under the name of "Josephson Junction" effects. These effects can be used for electronic computer switching, microwave radiation and detection, infra red detection, voltage/current/magnetic field measurement (e.g. SQUID technology), frequency measurement, and other applications as well.

In conclusion, the use of quenched $YBa_2Cu_3O_x$ as a very high dielectric constant material in capacitors, the fabrication of an intimate and localized interface between a metal and an insulator or a superconductor and an insulator, and the capability of fine line, non-contact, two and three dimensional patterning compatible with integrated circuit technology represent diverse and important applications from the processing discoveries according to this invention.

Although the invention has been described with certain particularity, it is not meant to be limited to the described embodiments. Those skilled in the art will be aware of numerous modifications which can be made to the invention, and thus the invention encompasses any modifications which fall within the scope of the appended claims.

I claim:

1. A method of fabricating an electrical device comprising the steps of:

quenching a material sample comprising $YBa_2Cu_3O_6$ from at least about 850 degrees Celsius to produce a dielectric material having a high dielectric constant;

providing a first plate means for storing electrical charge at a first side of the dielectric material;

providing a second plate means for storing electrical charge at a second side of the dielectric material opposite to the first side of the dielectric material;

providing a first lead means adjacent to and in electrical contact with the first plate means for permitting electrical contact to the first plate means;

providing a second lead means adjacent to and in electrical contact with the second plate means for permitting electrical contact to the second plate means;

wherein the electrical device is a capacitor and the method further comprises the step of:

dimensioning the dielectric material or an overlapping area of the first and second plate means or varying the dielectric constant of the dielectric material to produce a useful, desired capacitance in the capacitor.

2. A method of fabricating an electrical device as recited in claim 1, wherein the step of quenching the material sample further comprises:

rapidly quenching the material sample from at least about the 850 degrees Celsius to room temperature within one second.

3. A method of fabricating an electrical device as recited in claim 1, wherein each of the first and second plate means comprises a superconducting plate.

4. A method of fabricating an electrical device as recited in claim 1, wherein the step of dimensioning the dielectric material or the overlapping area of the first and second plate means or varying the dielectric constant of the dielectric material further comprises:

dimensioning a thickness of the dielectric material, dimensioning the overlapping area of the first and second plate means, and varying the dielectric constant of the dielectric material as a function of temperature to produce the useful, desired capacitance in the capacitor.

5. A method of fabricating an electrical device as recited in claim 1, wherein the first and second plate means together comprise a pair of electrically conducting plates, the first and second lead means together comprise a pair of electrical leads, and wherein the steps of providing the first and second plate means and the steps of providing the first and second lead means further comprise:

providing a first one of the electrically conducting plates on the first side of the dielectric material;

providing a second one of the electrically conducting plates on the second side of the dielectric material;

providing a first one of the electrical leads adjacent to and in electrical contact with the first electrically conducting plate; and providing a second one of the electrical leads adjacent to and in electrical contact with the second electrically conducting plate.

6. A method of fabricating an electrical device as recited in claim 1, wherein the first plate means comprises silver, the second plate means comprises silver, and wherein the steps of providing the first and second plate means further comprise:

providing the first plate means, comprising the silver, on the first side of the dielectric material; and providing the second plate means, comprising the silver, on the second side of the dielectric material.

7. A method of fabricating an electrical device as recited in claim 1, wherein the steps of providing the first and second lead means further comprise:

providing the first lead means so as to extend from the first plate means; and providing the second lead means so as to extend from the second plate means.

8. A method of fabricating an electrical device as recited in claim 1, wherein the first and second plate means are electrically conducting and not superconducting, and wherein the step of dimensioning the dielectric material or the overlapping area of the first and second plate means or varying the dielectric constant of the dielectric material specifically comprises:

providing the dielectric material with a dimensioned thickness necessary both to allow electrical charge to be stored in the electrically conducting first and second plate means and to produce the useful, desired capacitance in the electrical device.

9. A method of fabricating an electrical device as recited in claim 1, wherein the first and second plate means are electrically superconducting, and wherein the step of dimensioning the dielectric material or the overlapping area of the first and second plate means or varying the dielectric constant of the dielectric material specifically comprises:

providing the dielectric material with a dimensioned thickness necessary both to allow electrical charge to be stored in the electrically superconducting first and second plate means and to produce the useful, desired capacitance in the electrical device.

10. A method of patterning a film of material comprising $YBa_2Cu_3O_x$ so as to provide the film with a first region of an electrically resistive and high dielectric constant material phase of the material which lies adjacent to a second region of a conducting or superconducting material phase of the material, the film of material being initially prepared according to standard practices so as to comprise the conducting or superconducting material phase of the material, the method comprising the step of:

illuminating the first region with a laser beam so as to provide a localized heating of the first region and subsequent rapid quenching thereof, thereby producing the electrically resistive and high dielectric constant material phase of the material in the first region while leaving the material phase of the material in the second region unchanged, and wherein a penetration depth of the laser beam is less than a thickness of the film of material, thereby causing the illuminating to produce three dimensional patterning.

11. An electrical device comprising:

a dielectric material comprising a quenched material phase of $YBa_2Cu_3O_x$ in the form $YBa_2Cu_3O_6$ obtained by quenching the $YBa_2Cu_3O_x$ sufficiently rapidly to obtain a useful high dielectric constant, high electrical resistivity phase in the $YBa_2Cu_3O_6$, the dielectric material having a pair of opposite sides;

a first plate means for storing electrical charge provided on a first one of the pair of opposite sides of the dielectric material;

a second plate means for storing electrical charge provided on a second one of the pair of opposite sides of the dielectric material;

a first lead means adjacent to and in electrical contact with the first plate means for permitting electrical contact to the first plate means;

a second lead means adjacent to and in electrical contact with the second plate means for permitting electrical contact to the second plate means;

wherein the electrical device is a capacitor having a useful desired capacitance and is adapted to be used in diverse electrical and electronic applications for storage of electrical charge.

12. An electrical device as recited in claim 11, wherein each of the first and second plate means comprises a superconducting plate so as to provide decreased charge and discharge times for the capacitor.

13. An electrical device as recited in claim 11, wherein each of the first and second plate means comprises an electrically conducting plate, and each of the first and second lead means comprises an electrical lead, each one of the electrical leads being adjacent to and in electrical contact with a different one of the electrically conducting plates, and wherein a thickness of the dielectric material and an overlapping area of the first and second plate means are dimensioned to produce both the useful, desired capacitance and a charge storing ability in the capacitor.

14. An electrical device as recited in claim 11, wherein each of the first and second plate means comprises silver.

15. An electrical device as recited in claim 11, wherein the first lead means extends from the first plate means, and the second lead means extends from the second plate means.

16. An electrical device as recited in claim 11, wherein the first and second plate means are electrically conducting and not superconducting, and wherein the dielectric material is provided with a thickness which both allows electrical charge to be stored in the electrically conducting first and second plate means and produces the useful, desired capacitance in the electrical device.

17. An electrical device as recited in claim 11, wherein the first and second plate means are electrically superconducting, and wherein the dielectric material is provided with a thickness which both allows electrical charge to be stored in the electrically superconducting first and second plate means and produces the useful, desired capacitance in the electrical device.

18. An electrical device consisting essentially of:

a dielectric material configured so as to have a pair of opposite sides, the dielectric material comprising a high dielectric constant, high electrical resistivity material phase of yttrium barium copper oxide obtained by heating the yttrium barium copper oxide to at least about 850 degrees Celsius and then quenching the yttrium barium copper oxide from the at least about 850 degrees Celsius at a sufficiently rapid rate so as to produce the high dielectric constant, high electrical resistivity material phase in the yttrium barium copper oxide;

a first plate means for storing electrical charge provided on a first one of the pair of opposite sides of the dielectric material;

a second plate means for storing electrical charge provided on a second one of the pair of opposite sides of the dielectric material;

a first lead means adjacent to and in electrical contact with the first plate means for permitting electrical contact to the first plate means; and a second lead means adjacent to and in electrical contact with the second plate means for permitting electrical contact to the second plate means;

wherein the electrical device is a capacitor having a useful, desired capacitance and is adapted to be used in diverse electrical and electronic applications for the storage of electrical charge.

* * * * *